United States Patent
Bouras et al.

(10) Patent No.: US 10,098,260 B2
(45) Date of Patent: Oct. 9, 2018

(54) THERMAL MANAGEMENT SYSTEMS FOR ELECTRONICS

(71) Applicant: Hamilton Sundstrand Corporation, Charlotte, NC (US)

(72) Inventors: Scott R. Bouras, Rockford, IL (US); Kris H. Campbell, Poplar Grove, IL (US); Shin Katsumata, Rockford, IL (US); Charles Shepard, DeKalb, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 50 days.

(21) Appl. No.: 15/213,212

(22) Filed: Jul. 18, 2016

(65) Prior Publication Data
US 2018/0020573 A1 Jan. 18, 2018

(51) Int. Cl.
*F25D 23/12* (2006.01)
*H05K 7/20* (2006.01)

(52) U.S. Cl.
CPC ......... *H05K 7/20381* (2013.01); *H05K 7/203* (2013.01); *H05K 7/20309* (2013.01); *H05K 7/20318* (2013.01); *H05K 7/20354* (2013.01); *H05K 7/20881* (2013.01)

(58) Field of Classification Search
CPC .... G06F 1/20; F25B 1/10; F25B 13/00; F25B 9/008; H05K 7/203
USPC ............................................... 62/259.2, 498
See application file for complete search history.

(56) References Cited

U.S. PATENT DOCUMENTS

| | | | |
|---|---|---|---|
| 5,497,629 A * | 3/1996 | Rafalovich | F24D 11/0214 62/199 |
| 5,680,898 A * | 10/1997 | Rafalovich | F24F 5/0017 165/236 |
| 7,011,143 B2 * | 3/2006 | Corrado | G06F 1/20 165/104.33 |
| 7,266,969 B2 | 9/2007 | Hsu et al. | |
| 7,334,422 B2 | 2/2008 | Zywiak et al. | |
| 7,436,666 B1 * | 10/2008 | Konshak | G06F 1/20 165/104.33 |
| 8,184,436 B2 | 5/2012 | Campbell et al. | |
| 8,760,855 B2 | 6/2014 | Howes et al. | |
| 8,936,071 B2 | 1/2015 | Bruno et al. | |
| 9,101,078 B2 | 8/2015 | Campbell et al. | |
| 9,167,720 B2 | 10/2015 | Uluc et al. | |
| 9,210,830 B2 | 12/2015 | Campbell et al. | |
| 9,238,398 B2 | 1/2016 | Lu et al. | |

(Continued)

*Primary Examiner* — Melvin Jones
(74) *Attorney, Agent, or Firm* — Locke Lord LLP; Daniel J. Fiorello; Scott D. Wofsy

(57) ABSTRACT

A refrigeration system for electronics includes a compressor disposed on a main line and configured to compress a refrigerant in the refrigeration system and a condenser disposed downstream of the compressor on the main line. An evaporator line is in fluid communication with the main line downstream of the condenser and has an evaporator configured to receive heat into the refrigerant from an external heat source. The system also includes an immersion line in fluid communication with main line downstream of the condenser. The immersion line includes an immersion cooling container that is configured to at least partially house electronics such that the electronics are in direct fluid communication with the refrigerant to cool the electronics.

17 Claims, 3 Drawing Sheets

(56) References Cited

U.S. PATENT DOCUMENTS

| | | |
|---|---|---|
| 9,332,671 B2 | 5/2016 | Schult et al. |
| 9,332,674 B2 | 5/2016 | Campbell et al. |
| 2007/0193300 A1* | 8/2007 | Tilton .................... F25B 43/04 62/475 |
| 2009/0260777 A1* | 10/2009 | Attlesey .................... G06F 1/20 165/67 |
| 2015/0257303 A1* | 9/2015 | Shedd .................... F25B 41/00 62/62 |

* cited by examiner

THERMAL MANAGEMENT SYSTEMS FOR ELECTRONICS

BACKGROUND

1. Field

The present disclosure relates to thermal management, more specifically to thermal management systems for electronics (e.g., for aircraft electronics)

2. Description of Related Art

Aircraft electronics systems continue to utilize an increasing amount of power and thereby generate more thermal losses which must be rejected to prevent overheating. Traditionally, systems to cool avionics and other electronics are independent systems that add weight and complexity to the aircraft in their own right.

Such conventional methods and systems have generally been considered satisfactory for their intended purpose. However, there is still a need in the art for thermal management systems for electronics. The present disclosure provides a solution for this need.

SUMMARY

In accordance with at least one aspect of this disclosure, a refrigeration system for electronics includes a compressor disposed on a main line and configured to compress a refrigerant in the refrigeration system and a condenser disposed downstream of the compressor on the main line. An evaporator line is in fluid communication with the main line downstream of the condenser and has an evaporator configured to receive heat into the refrigerant from an external heat source. The system also includes an immersion line in fluid communication with main line downstream of the condenser. The immersion line includes an immersion cooling container that is configured to at least partially house electronics such that the electronics are in direct fluid communication with the refrigerant to cool the electronics.

In this regard, the refrigerant can be a dielectric fluid or any other suitable non-conductive fluid. Any other suitable fluid is contemplated herein.

The evaporator line can include a first expansion valve and the immersion line can include a second expansion valve disposed in parallel with the first expansion valve. The evaporator can be downstream of the first expansion valve and the immersion cooling container can be downstream of the second expansion valve. The condenser can be upstream of both of the first expansion valve and the second expansion valve. The first expansion valve can be the same or different from the second expansion valve.

The system can further include a controller configured to actuate the first expansion valve and/or the second expansion valve. In certain embodiments, the system can include a liquid level sensor disposed in functional relationship with the immersion cooling container to sense a liquid level in the immersion cooling container. The controller can be operatively connected to the liquid level sensor to receive sensor readings from the liquid level sensor such that the controller is configured to control the second expansion valve as a function of the liquid level.

In certain embodiments, a temperature sensor is disposed in thermal communication with the evaporator and/or the evaporator line downstream of the evaporator to sense a temperature of the refrigerant. The controller can be operatively connected to the temperature sensor to receive sensor readings from the temperature sensor, wherein the controller is configured to actuate the first and/or second expansion valve as a function of the temperature. In certain embodiments, the controller can be operatively connected to the compressor and configured to control a compressor speed as a function of the evaporator outlet temperature and/or liquid level in the immersion cooling container.

In certain embodiments, the system can include a flash tank disposed upstream of the first and second expansion valves and configured to partially expand the refrigerant. A flash tank orifice can be disposed upstream of the flash tank. The system can include a flash tank return valve configured to allow return flow to the compressor via a flash tank return line.

The system can include a sub-cooler line in fluid communication with the main line downstream of the condenser, the sub-cooler line including a sub-cooler and a sub-cooler expansion valve disposed upstream of the sub-cooler. The sub-cooler can be in thermal communication with one or more of the main line, the evaporator line, or the immersion line and the sub-cooler line. The sub-cooler can be configured to cool the refrigerant upstream of the first expansion valve and the second expansion valve. The sub-cooler can return vaporized refrigerant to the compressor via a sub-cooler return line.

The electronics can be aircraft electronics or the electronics of any other suitable vehicle, for example. In certain embodiments, the external heat source can be a fluid coolant line of an aircraft. For example, the compressor can be an environmental control system compressor of an aircraft. In certain embodiments, the compressor can be any other suitable vapor cycle thermal management system compressor present on the aircraft (e.g., a Supplemental Cooling Unit).

These and other features of the systems and methods of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
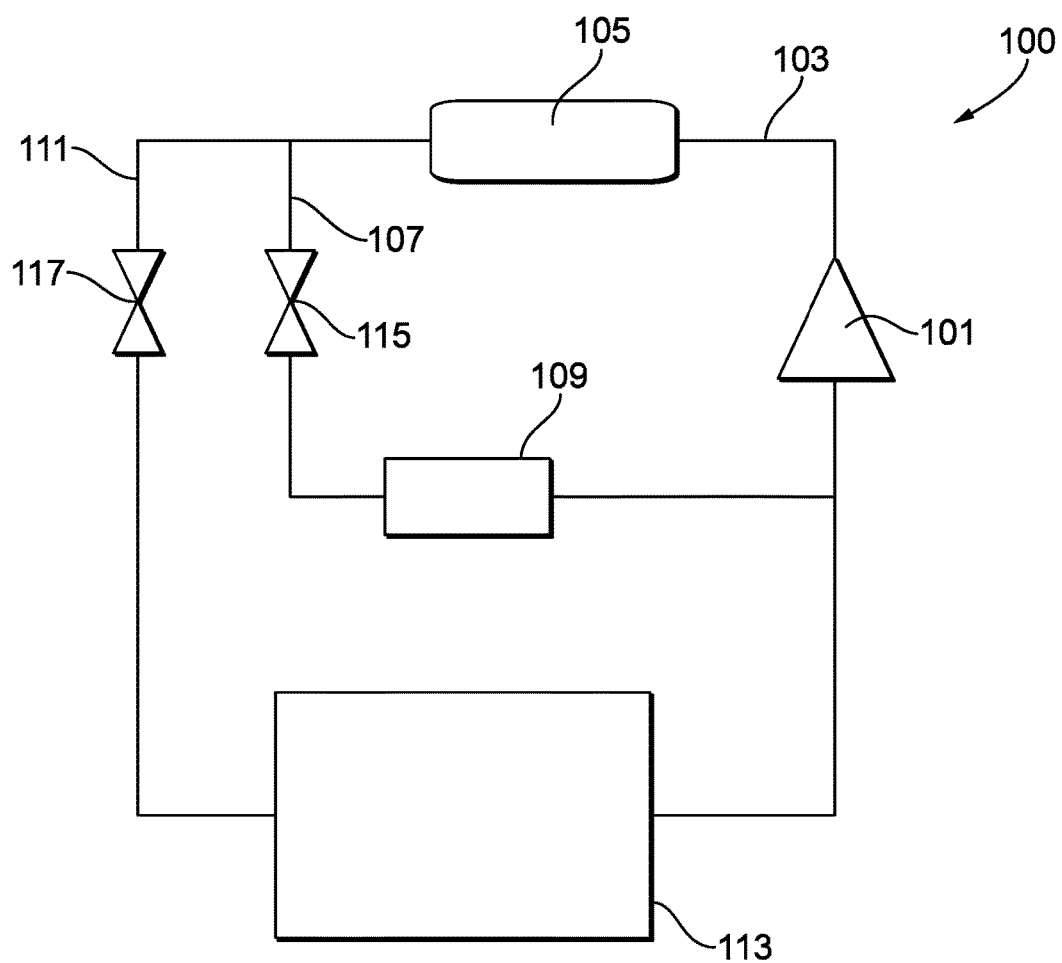
FIG. 1 is a schematic view of an embodiment of a system in accordance with this disclosure.
Figure 2:
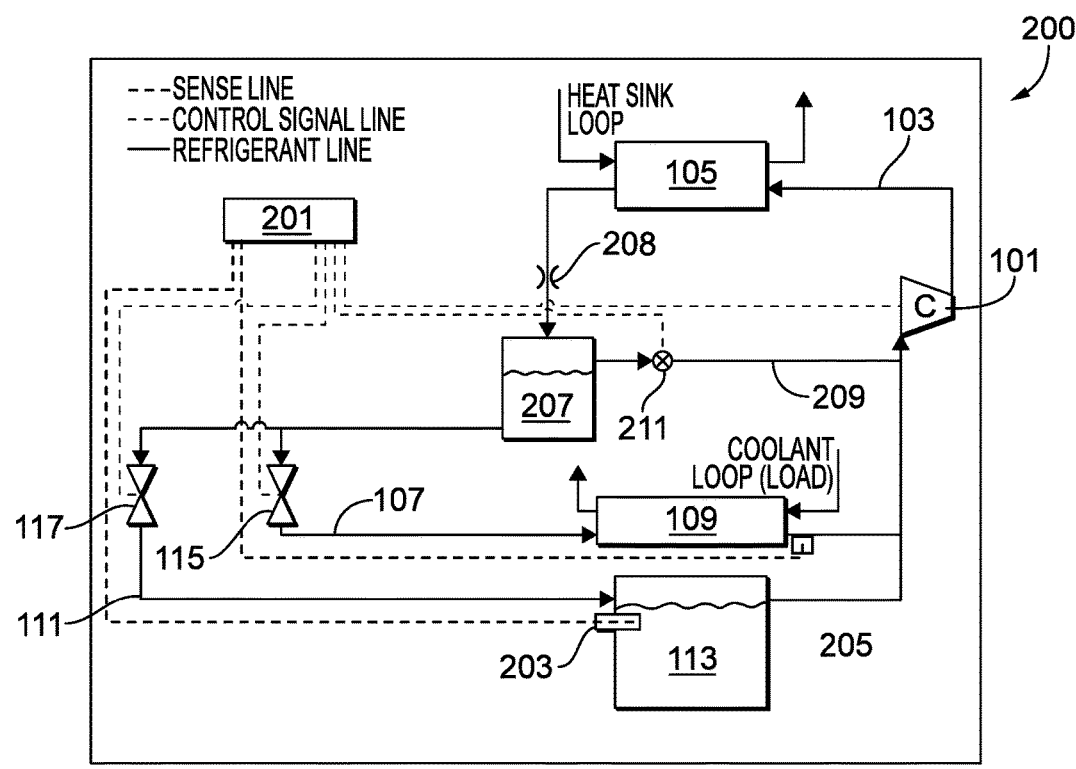
FIG. 2 is a schematic view of an embodiment of a system in accordance with this disclosure.
Figure 3:
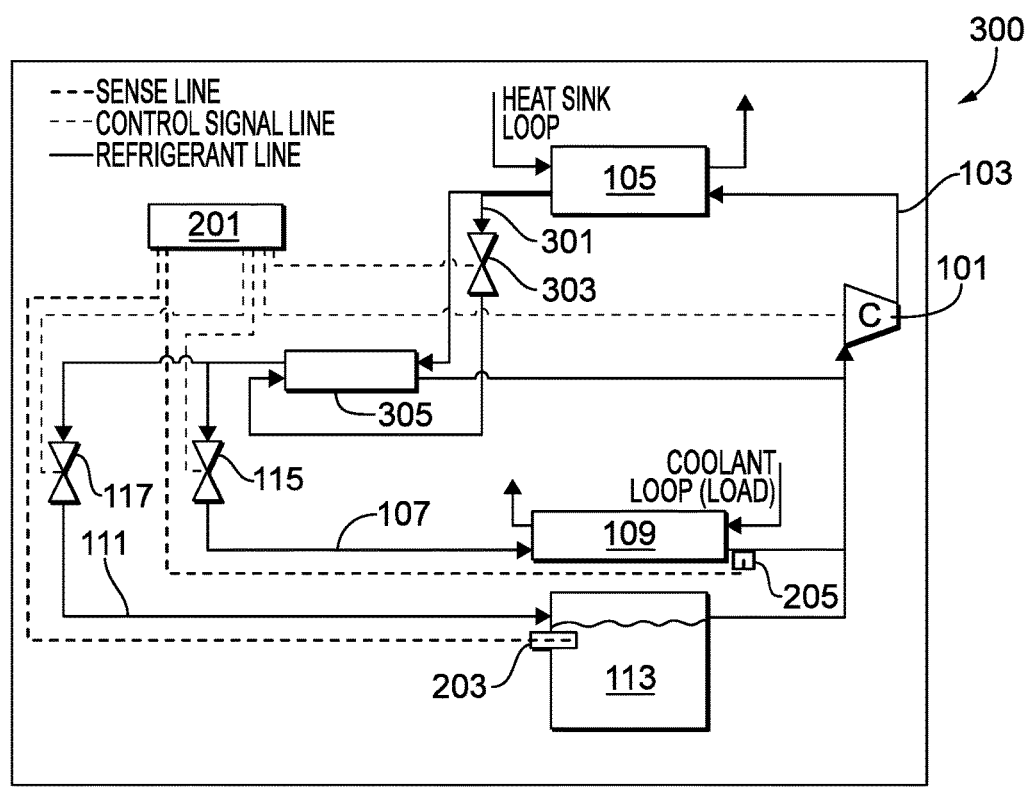
FIG. 3 is a schematic view of an embodiment of a system in accordance with this disclosure.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIGS. 2 and 3. The systems and methods described herein can be used to cool electronics while reducing weight and/or complexity by utilizing existing systems of a vehicle (e.g., in an aircraft), for example.

Referring to FIG. 1, a refrigeration system 100 for electronics includes a compressor 101 (e.g., an electric motor compressor) disposed on a main line 103 and configured to compress a refrigerant in the refrigeration system 100. The system 100 also includes a condenser 105 disposed downstream of the compressor 101 on the main line 103. An evaporator line 107 is in fluid communication with the main line 103 downstream of the condenser 105, has an evaporator 109 configured to receive heat into the refrigerant from an external heat source (e.g., a coolant of an aircraft system), and is connected to the low pressure side of the compressor 101.

The system 100 also includes an immersion line 111 in fluid communication with main line 103 downstream of the condenser 105 and with the low pressure side of the compressor 101. The immersion line 111 includes an immersion cooling container 113 that is configured to at least partially house electronics (e.g., aircraft electronics, not shown) such that the electronics are in direct fluid communication with the refrigerant to cool the electronics. In this regard, the refrigerant can be a dielectric fluid or any other suitable non-conductive fluid (e.g., to prevent electrical discharge into the refrigerant). It is also contemplated that the refrigerant can be selected to be non-corrosive to the electronics. Any other suitable fluid is contemplated herein.

The evaporator line 107 can include a first expansion valve 115 and the immersion line 111 can include a second expansion valve 117. The first expansion valve 115 and the second expansion valve 117 can be disposed in parallel with each other as shown in FIG. 1. While the first and second expansion valves 115, 117 are referred to as "valves," it is appreciated by those having ordinary skill in the art that one of the first and second expansion valves 115, 117 may be fixed expansion orifices and does not necessarily need to have the ability to change the restriction size and/or shut off flow.

The evaporator 109 can be positioned downstream of the first expansion valve 115 and the immersion cooling container 113 can be positioned downstream of the second expansion valve 117. The condenser 105 can be upstream of both of the first expansion valve 115 and the second expansion valve 117. The first expansion valve 115 can be the same as or different from the second expansion valve 117 as appreciated by those having ordinary skill in the art.

Referring additionally to FIGS. 2 and 3, an embodiment of a system 200 can further include a controller 201 configured to actuate the first expansion valve 115 and/or the second expansion valve 117. In certain embodiments, the system 100 can include a liquid level sensor 203 disposed in functional relationship with the immersion cooling container 113 to sense a liquid level in the immersion cooling container 113. The controller 201 can be operatively connected to the liquid level sensor 203 to receive sensor readings from the liquid level sensor 203 such that the controller 201 is configured to control the second expansion valve 117 as a function of the liquid level in the immersion cooling container 113.

The second expansion valve 117 can be controlled to ensure that the refrigerant remains liquid enough to submerge the electronics in refrigerant within the immersion cooling container 113. Therefore, if there is too little liquid, the second expansion valve 117 can open up to widen the restriction and reduce the effect of the second expansion valve 117 and allow more liquid through.

In certain embodiments, a temperature sensor 205 is disposed in thermal communication with the evaporator 109 and/or the evaporator line 107 downstream of the evaporator 109 (or in any other suitable location) to sense a temperature of the refrigerant at the evaporator outlet. The controller 201 can be operatively connected to the temperature sensor 205 to receive sensor readings from the temperature sensor. In certain embodiments, the controller 201 is configured to actuate the first and/or second expansion valve 115, 117 as a function of the temperature. In certain embodiments, the controller 201 can be operatively connected to the compressor 101 and configured to control a compressor speed as a function of the temperature and/or liquid level in the immersion cooling container 113. For example, if greater cooling is needed, the compressor 101 can be sped up.

In certain embodiments, as shown in FIG. 2, the system 200 can include a flash tank 207 disposed upstream of the first and second expansion valves 115, 117 and configured to partially expand the refrigerant (e.g., which can be bled off into the compressor 101). A flash tank orifice 208 can be disposed upstream of the flash tank 207. The system 200 can include a flash tank return valve 211 configured to allow return flow to the compressor 101 via a flash tank return line 209. The flash tank return valve 211 can be operatively connected to the controller 201 such that the controller 201 can actuate the flash tank return valve 211.

Referring additionally to FIG. 3, an embodiment of a system 300 can include any suitable components as systems 100 and 200 described above as well as a sub-cooler line 301 in fluid communication with the main line 103 downstream of the condenser 105. The sub-cooler line 301 can include a sub-cooler 305 and a sub-cooler expansion valve 303 disposed upstream of the sub-cooler 305. As shown, the sub-cooler 305 can be in thermal communication with one or more of the main line 103, the evaporator line 107, or the immersion line 111 and the sub-cooler line 301 to exchange heat between the sub-cooler line 301 and one or more of the other lines 103, 107, 111. The sub-cooler 305 can be configured to cool the refrigerant upstream of the first expansion valve 115 and the second expansion valve 117 as appreciated by those skilled in the art.

As described above, the electronics can be aircraft electronics (e.g., avionics) or the electronics of any other suitable vehicle, for example. In certain embodiments, the external heat source can be a fluid coolant line (e.g., of an environmental control system) of an aircraft (e.g., as shown in FIGS. 2 and 3). The compressor 101 can be an environmental control system compressor (e.g., with an electric driven motor) of an aircraft. In certain embodiments, the compressor can be any other suitable vapor cycle thermal management system compressor present on the aircraft (e.g., from a Supplemental Cooling Unit).

Embodiments as described above combine immersion cooling of electronics with vapor cycle systems (VCS) already present in many vehicles (e.g., an aircraft). Presently liquid cooled aerospace electronics reject thermal energy via a liquid cold plate which circulates on a dedicated line. Embodiments take the electronics off of the dedicated liquid line and incorporate immersion cooling in parallel with an existing VCS on the aircraft, for example (e.g., a Supplemental Cooling Unit, Environmental Control System, etc.). Refrigerant from the VCS system is bled off via the parallel connection between the first and second expansion valves 115, 117 and sent to the electronics components for immersion cooling. Vaporized refrigerant from the electronics is returned to the compressor 101 as shown.

Integrating immersion cooled electronics with existing VCS on the aircraft can achieve performance improvements due to maximizing the synergies of the thermal management systems. Reduced weight and power demand of the thermal management system is possible as well as potential for increased power capability of the electronics due to the increased heat transfer that is possible with two phase immersion cooling versus forced convection cooling of a liquid cooled cold plate.

The methods and systems of the present disclosure, as described above and shown in the drawings, provide for thermal management systems with superior properties as described above. While the apparatus and methods of the subject disclosure have been shown and described with reference to embodiments, those skilled in the art will readily appreciate that changes and/or modifications may be made thereto without departing from the spirit and scope of the subject disclosure.

What is claimed is:

1. A refrigeration system for electronics, comprising:
a compressor configured to compress a refrigerant in the refrigeration system and disposed on a main line;
a condenser disposed downstream of the compressor on the main line;
an evaporator line in fluid communication with the main line downstream of the condenser, the evaporator line having an evaporator configured to receive heat into the refrigerant from an external heat source; and
an immersion line in fluid communication with main line downstream of the condenser, the immersion line having an immersion cooling container, the immersion cooling container configured to at least partially house electronics such that the electronics are in direct fluid communication with the refrigerant to cool the electronics.

2. The system of claim 1, wherein the evaporator line includes a first expansion valve and the immersion line includes a second expansion valve disposed in parallel with the first expansion valve, wherein the evaporator is downstream of the first expansion valve and the immersion cooling container is downstream of the second expansion valve, wherein the condenser is upstream of both of the first expansion valve and the second expansion valve.

3. The system of claim 2, wherein the first expansion valve is different from the second expansion valve.

4. The system of claim 2, further comprising a controller configured to actuate the first expansion valve and/or the second expansion valve.

5. The system of claim 4, further comprising a liquid level sensor disposed in functional relationship with the immersion cooling container to sense a liquid level in the immersion cooling container.

6. The system of claim 5, wherein the controller is operatively connected to the liquid level sensor to receive sensor readings from the liquid level sensor, wherein the controller is configured to control the second expansion valve as a function of the liquid level.

7. The system of claim 4, further comprising a temperature sensor disposed in thermal communication with the evaporator and/or the evaporator line downstream of the evaporator to sense a temperature of the refrigerant.

8. The system of claim 7, wherein the controller is operatively connected to the temperature sensor to receive sensor readings from the temperature sensor, wherein the controller is configured to actuate the first and/or second expansion valve as a function of the temperature.

9. The system of claim 7, wherein the controller is operatively connected to the temperature sensor to receive sensor readings from the temperature sensor, wherein the controller is operatively connected to the compressor and configured to control a compressor speed as a function of the temperature.

10. The system of claim 2, further comprising a flash tank disposed upstream of the first and second expansion valves and configured to partially expand the refrigerant.

11. The system of claim 10, further comprising a flash tank orifice disposed upstream of the flash tank.

12. The system of claim 11, further comprising a flash tank return valve configured to allow return flow to the compressor via a flash tank return line.

13. The system of claim 1, further comprising a sub-cooler line in fluid communication with the main line downstream of the condenser, the sub-cooler line including a sub-cooler and a sub-cooler expansion valve disposed upstream of the sub-cooler, wherein the sub-cooler is in thermal communication with one or more of the main line, the evaporator line, or the immersion line and the sub-cooler line, wherein the sub-cooler is configured to cool the refrigerant upstream of the first expansion valve and the second expansion valve.

14. The system of claim 1, wherein the electronics are aircraft electronics.

15. The system of claim 1, wherein the external heat source is a fluid coolant line of an aircraft.

16. The system of claim 1, wherein the compressor is a vapor cycle thermal management system compressor of an aircraft.

17. The system of claim 1, wherein the refrigerant is a dielectric fluid.

* * * * *